US011652413B2

(12) United States Patent
Li et al.

(10) Patent No.: US 11,652,413 B2
(45) Date of Patent: May 16, 2023

(54) BOOST CONVERTER WITH DOWN-MODE

(71) Applicant: TEXAS INSTRUMENTS INCORPORATED, Dallas, TX (US)

(72) Inventors: Linjue Li, Shanghai (CN); Jian Liang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/114,840

(22) Filed: Dec. 8, 2020

(65) Prior Publication Data

US 2022/0037998 A1    Feb. 3, 2022

Related U.S. Application Data

(63) Continuation of application No. PCT/CN2020/105422, filed on Jul. 29, 2020.

(30) Foreign Application Priority Data

Jul. 29, 2020    (CN) ................. PCT/CN2020/105422

(51) Int. Cl.
    *H02M 3/158*      (2006.01)
    *H03K 5/24*       (2006.01)
    *G01R 19/165*     (2006.01)
    *H02M 1/00*       (2006.01)

(52) U.S. Cl.
    CPC ...... *H02M 3/158* (2013.01); *G01R 19/16538* (2013.01); *H03K 5/24* (2013.01); *H02M 1/0009* (2021.05); *H02M 1/0012* (2021.05); *H02M 1/0025* (2021.05)

(58) Field of Classification Search
None
See application file for complete search history.

(56) References Cited

U.S. PATENT DOCUMENTS 6,166,528 A * 12/2000 Rossetti ............. H02M 3/1588
                                                  323/283
7,372,240 B2 * 5/2008 Khayat ................. H02M 3/157
                                                   323/283

(Continued)

FOREIGN PATENT DOCUMENTS

| CN | 204707029 | 10/2015 |
|---|---|---|
| CN | 107005158 | 8/2017 |

(Continued)

OTHER PUBLICATIONS

International Search Report in Corresponding PCT Application No. PCT/CN2020/105422 dated Apr. 26, 2021 (5 pages).

Primary Examiner — Jeffrey A Gblende
(74) Attorney, Agent, or Firm — Ray A. King; Frank D. Cimino

(57) ABSTRACT

A boost converter includes an input terminal, an output terminal, a switching terminal, a low-side transistor, and a down-mode detection circuit. The low-side transistor is coupled to the switching terminal. The down-mode detection circuit is coupled to the low-side transistor. The down-mode detection circuit is configured to detect a voltage at the output terminal greater than a voltage at the input terminal, and turn off the low-side transistor based on the voltage at the output terminal being greater than the voltage at the input terminal.

16 Claims, 7 Drawing Sheets

(56) References Cited

U.S. PATENT DOCUMENTS

| | | | | |
|---|---|---|---|---|
| 8,278,783 | B2* | 10/2012 | Nishijima | H02M 3/157 |
| | | | | 307/140 |
| 10,079,539 | B2* | 9/2018 | Hsiao | H02M 3/158 |
| 11,196,339 | B1* | 12/2021 | Jodka | H02M 1/08 |
| 2012/0249214 | A1 | 10/2012 | Lee et al. | |
| 2021/0328497 | A1* | 10/2021 | Sun | H02M 3/156 |
| 2021/0336468 | A1* | 10/2021 | Nandimandalam Venkata | |
| | | | | H02J 7/0029 |

FOREIGN PATENT DOCUMENTS

| CN | 110663164 | 1/2020 |
|---|---|---|
| CN | 110865227 | 3/2020 |

* cited by examiner

BOOST CONVERTER WITH DOWN-MODE

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

Some switch-mode power supply topologies include a drive/power transistor coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. Switch-mode power supplies are widely used in electronic devices, particularly battery powered devices, such as portable cellular phones, laptop computers, automobiles, industrial tools, and other electronic systems in which efficient use of power is desirable.

SUMMARY

Boost converters that provide efficient operation when the boost converter input voltage exceeds the boost converter output voltage are disclosed herein. In one example, a boost converter includes a switching terminal, a ground terminal, a down-mode detection circuit, a modulation circuit, a low-side transistor, and a switch. The down-mode detection circuit includes an output terminal. The modulation circuit includes an output terminal. The low-side transistor includes a first terminal, a second terminal, and a third terminal. The first terminal is coupled to the switching terminal. The second terminal is coupled to the ground terminal. The switch includes a first terminal, a second terminal, a third terminal, and a control terminal. The first terminal of the switch is coupled to third terminal of the low-side transistor. The second terminal of the switch is coupled to the output terminal of the modulation circuit. The third terminal of the switch is coupled to the ground terminal. The control terminal of the switch is coupled to the output terminal of the down-mode detection circuit.

In another example, a boost converter includes an input terminal, an output terminal, a switching terminal, a low-side transistor, and a down-mode detection circuit. The low-side transistor is coupled to the switching terminal. The down-mode detection circuit is coupled to the low-side transistor. The down-mode detection circuit is configured to detect a voltage at the output terminal greater than a voltage at the input terminal, and turn off the low-side transistor based on the voltage at the output terminal being greater than the voltage at the input terminal.

In a further example, a boost converter includes an input terminal, an output terminal, a switching terminal, a ground terminal, a high-side transistor, a first switch, a low-side transistor, and a second switch. The high-side transistor includes a first terminal, a second terminal, and a third terminal. The first terminal of the high-side transistor is coupled to the switching terminal. The second terminal of the high-side transistor is coupled to the output terminal. The first switch is coupled to the third terminal of the high-side transistor. The first switch is configured to, in a down-mode, modulate a voltage at the third terminal of the high-side transistor between a voltage at the ground terminal and a voltage at the input terminal. The low-side transistor includes a first terminal, a second terminal, and a third terminal. The first terminal of the low-side transistor is coupled to the switching terminal. The second terminal of the low-side transistor is coupled to the ground terminal. The second switch is coupled to the third terminal of the low-side transistor. The second switch is configured to, in a down-mode, hold the third terminal of the low-side transistor at the voltage at the ground terminal.

BRIEF DESCRIPTION OF THE DRAWINGS

For a detailed description of various examples, reference will now be made to the accompanying drawings in which.

DETAILED DESCRIPTION

Boost converters use an inductor to produce an output voltage that is greater than the input voltage. However, in a variety of boost converter operational scenarios, the input voltage may exceed the output voltage. For example, at boost converter start-up or when output loading changes, the boost converter input voltage may exceed the converter output voltage. Some boost converters include circuitry that provides output voltage regulation when the input voltage exceeds the output voltage. Such operation is referred to as "down-mode" operation.

Figure 1A:
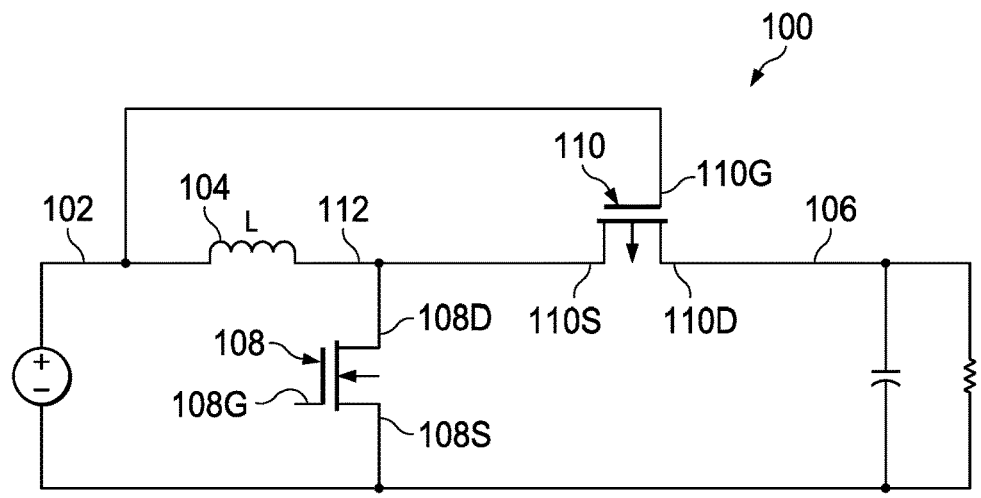
FIGS. 1A-1C illustrate an example of down-mode operation in a conventional boost converter.
Figure 1B:
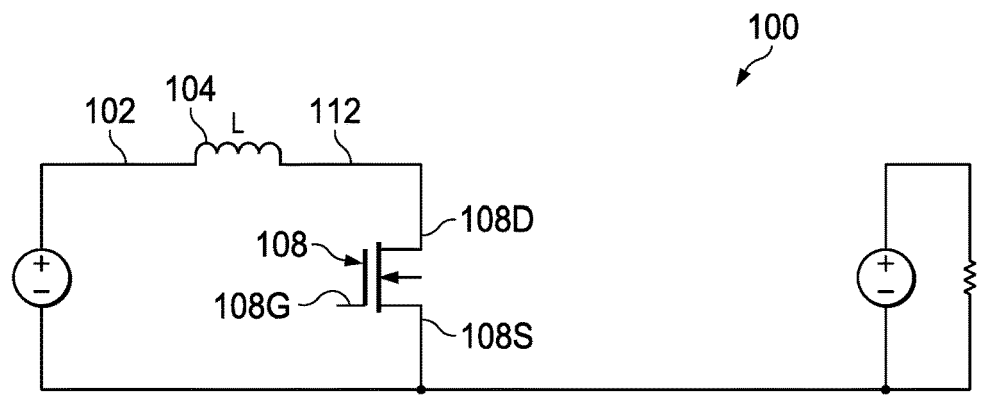
Figure 1C:
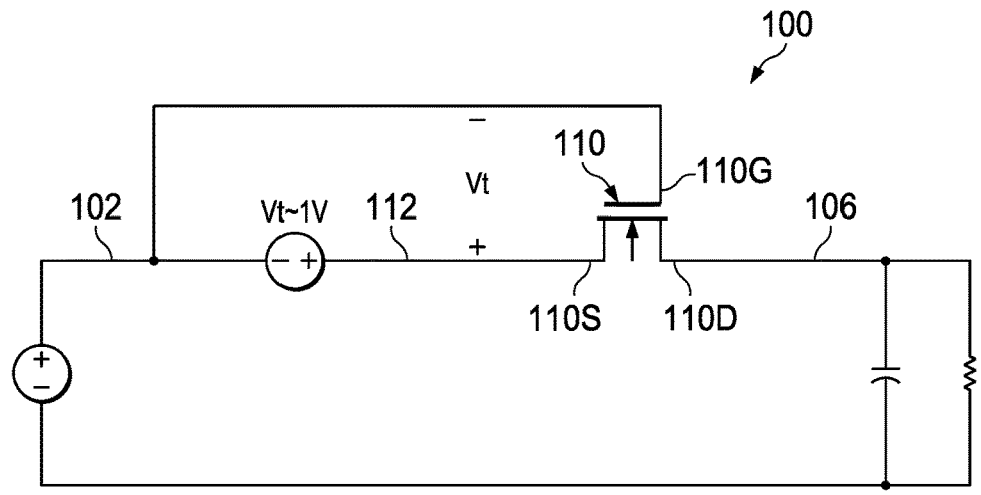

FIGS. 1A-1C show an example of down-mode operation in a conventional boost converter. In FIGS. 1A-1C, the input voltage provided to a boost converter 100 is greater than the output voltage of the boost converter 100. That is, the boost converter 100 is illustrated as operating in down-mode. The boost converter 100 includes an input terminal 102, an inductor 104, an output terminal 106, a low-side transistor 108, and a high-side transistor 110. The low-side transistor 108 may be an N-channel metal oxide semiconductor field effect transistor (MOSFET) and the high-side transistor 110 may be a P-channel MOSFET. When the boost converter 100 is operating in down-mode (similar to its operation in a non-down-mode), the low-side transistor 108 is turned on and off by a modulation circuit (not shown) to charge the inductor 104. In non-down-mode operation, the high-side transistor 110 is controlled by a modulation circuit (not shown) so that the high-side transistor 110 is off when the low-side transistor 108 is on, and the high-side transistor 110 is on when the low-side transistor 108 is off. In down-mode, the gate terminal 110G of the high-side transistor 110 is coupled to the input terminal 102. With the gate terminal 110G held at the voltage at the input terminal 102 (VIN), conduction of the high-side transistor 110 is controlled by the voltage at the source terminal 110S of the high-side transistor 110.

In FIG. 1B, the low-side transistor 108 is turned on to charge the inductor 104, the switching terminal 112 is pulled to ground, the high-side transistor 110 is turned off (and therefore not shown in FIG. 1B).

In FIG. 1C, the low-side transistor 108 is turned off (and therefore not shown in FIG. 1C). Charging of the inductor 104 in FIG. 1B produces a gate-to-source voltage across the high-side transistor 110 that is enough to place the high-side transistor 110 in a linear region and cause the high-side transistor 110 to operate as a pass transistor. When the high-side transistor 110 is operating as a pass transistor, its power dissipation may be substantial, and the efficiency of the boost converter 100 is relatively poor. The efficiency of the boost converter 100 in down-mode may be expressed as:

$$Eff = \frac{V_{OUT}}{V_{IN} + V_t}$$

where:
$V_{IN} > V_{OUT}$,
$V_t$ is the threshold voltage of the high-side transistor 110 (approximately 1 volt for a 7-volt P-channel MOSFET); and Eff is the efficiency of the boost converter 100, neglecting switching and control power losses.

Figure 2:
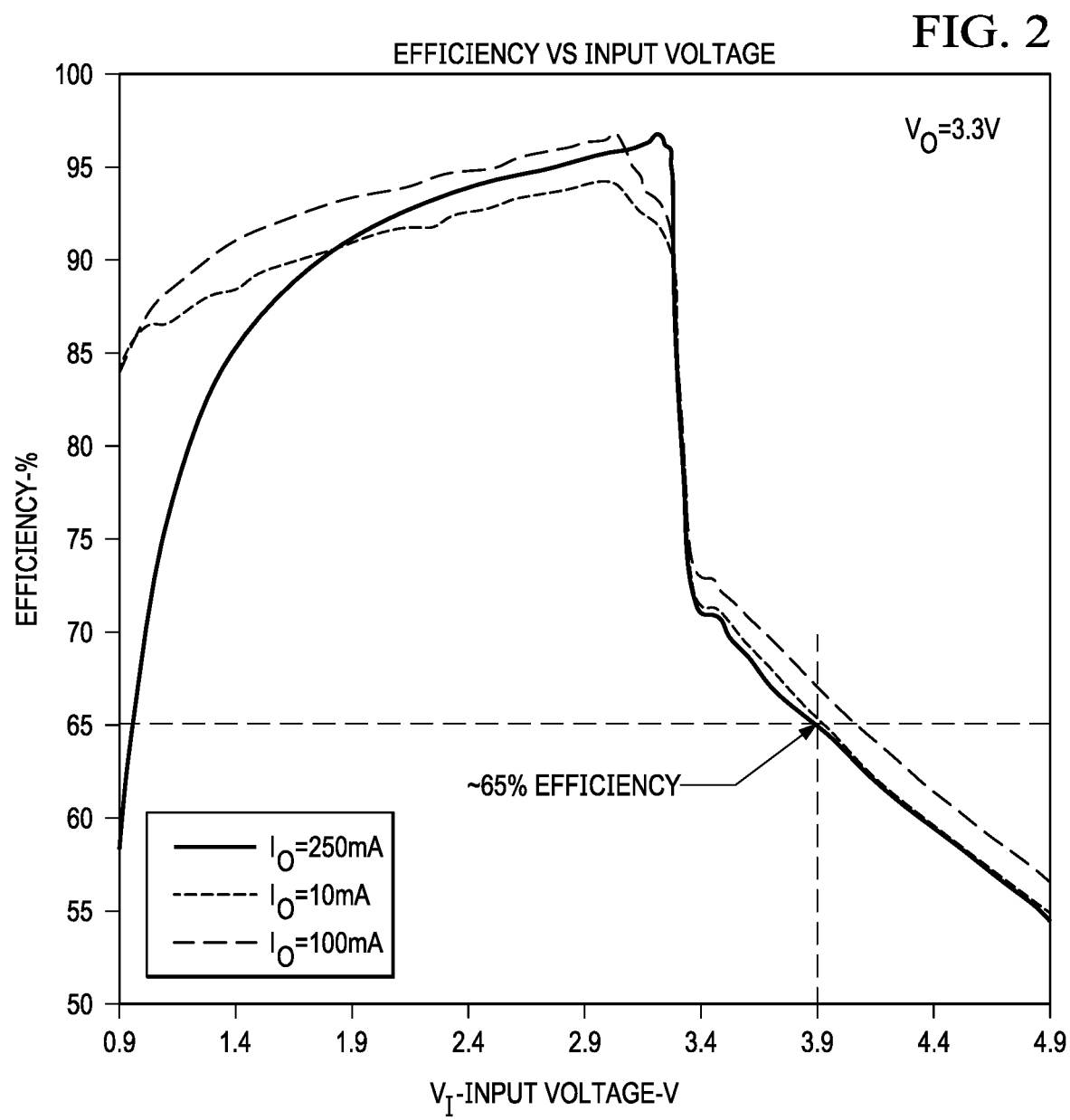
FIG. 2 shows a graph of efficiency versus input voltage for the down-mode operation of FIGS. 1A-1C.

FIG. 2 shows a graph of efficiency versus input voltage for the boost converter 100. With an input voltage of about 3.9 volts and an output voltage of 3.3 volts, the boost converter 100 is about 65% efficient. As shown in FIG. 2, the efficiency of the boost converter 100 is much higher when not operating in down-mode (when the input voltage is lower than the output voltage).

This disclosure describes embodiments of a boost converter that provides high-efficiency down-mode operation. In the high-efficiency down-mode operation, the high-side transistor switches while the low-side transistor remains off. As a result, the conductive loss and switching loss of the boost converter is reduced in down-mode and efficiency is improved. Additionally, because the low-side transistor is turned off and current flow through the high-side transistor is continuous, embodiments reduce switching noise while operating in down-mode relative to convention implementations. The boost converters of the present disclosure are suitable for use in a wide variety of applications that required a step up in power supply voltage, including battery powered devices, such as mobile telephones, gaming systems, and other portable electronic devices.

Figure 3:
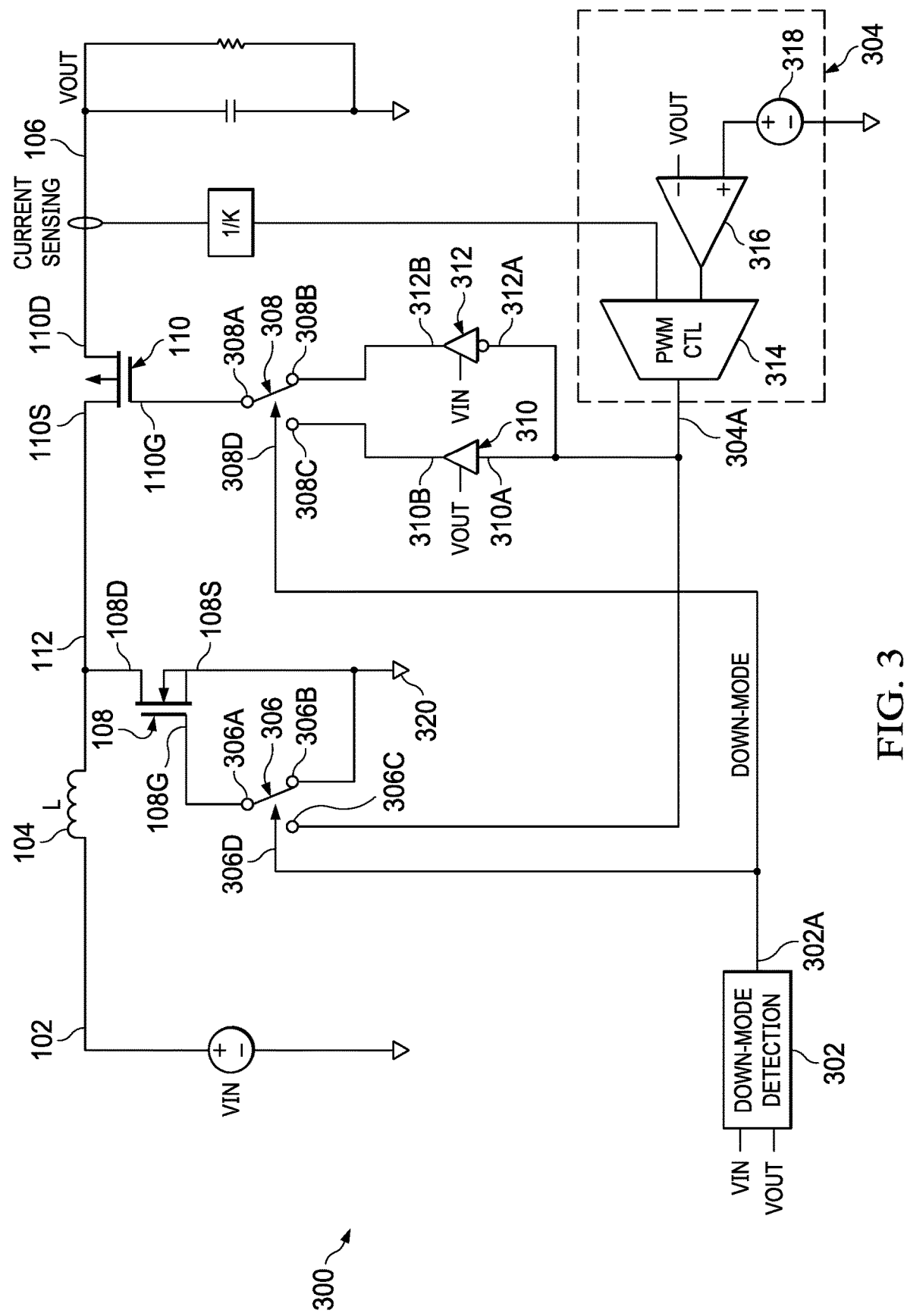
FIG. 3 shows a block diagram for an example boost converter that includes high efficiency down-mode operation.

FIG. 3 shows a block diagram for an example boost converter 300 that includes high efficiency down-mode operation. In the boost converter 300, while operating in down-mode, the low-side transistor 108 is held off, and the high-side transistor 110 is modulated to regulate the output voltage. Because the low-side transistor 108 is always off when operating in down-mode, the current output of the boost converter 300 is equal to the current input to the boost converter 300. The boost converter 300 provides efficiency of $$\frac{V_{OUT}}{V_{IN}},$$

which is much higher than the efficiency of the boost converter 100.

The boost converter 300 includes the input terminal 102, the inductor 104, the output terminal 106, the low-side transistor 108, the high-side transistor 110, and the switching terminal 112. The boost converter 300 also includes a down-mode detection circuit 302, a modulation circuit 304, a switch 306, a switch 308, a driver 310, and a driver 312. The down-mode detection circuit 302 compares VIN and VOUT to detect down-mode. If VIN is greater than VOUT, then the down-mode detection circuit 302 activates signal DOWN-MODE at the output terminal 302A to indicate that the boost converter 300 is operating in down-mode. The down-mode detection circuit 302 may include a comparator to compare VIN and VOUT.

The down-mode detection circuit 302 is coupled to the switch 306 and the switch 308 to control operation of the low-side transistor 108 and the high-side transistor 110 based on whether the boost converter 300 is operating in down-mode. The switch 306 turns off the low-side transistor 108 while the boost converter 300 is operating in down-mode, and modulates the low-side transistor 108 when the boost converter 300 is not operating in down-mode (operating in boost mode). The switch 306 includes a terminal 306A coupled to the gate terminal 108G of the low-side transistor 108, a terminal 306B coupled to a ground terminal 320, a terminal 306C coupled to the modulator circuit 304, and a control terminal 306D coupled to the output terminal 302A of the down-mode detection circuit 302. When the DOWN-MODE signal is active, the switch 306 routes a ground signal to the low-side transistor 108 by connecting the gate terminal 108G of the low-side transistor 108 to ground thereby turning off transistor 108 if it is implemented with an n-type transistor (such as an n-channel MOSFET). When the DOWN-MODE signal is inactive the switch 306 routes a modulation signal to the low-side transistor by connecting the gate terminal 108G of the low-side transistor 108 to the output terminal 304A of the modulation circuit 304.

The modulation circuit 304 generates the modulation signal to turn the low-side transistor 108 and the high-side transistor 110 on and off. In the boost converter 300, the modulation circuit 304 includes a pulse width modulation control circuit 314, an error amplifier 316, and a reference voltage circuit 318. The error amplifier 316 generates an error signal representative of the difference between VOUT and the reference voltage provided by the reference voltage circuit 318. The pulse width modulation control circuit 314 compares the error signal generated by the error amplifier 316 to the current ($I_S$) sensed at the output terminal 106 (downscaled by a scaling value $$\frac{1}{K}),$$

and generates the modulation signal based on the comparison. The current flowing through high-side transistor 110 (the current at the output terminal 106) may be sensed and scaled using a current mirror circuit.

The switch 308 controls the operation of the high-side transistor 110 based on the DOWN-MODE signal. When operating in down-mode, the switch 308 drives the gate terminal 110G of the high-side transistor 110 with a drive signal (e.g., an inverted version of the modulation signal generated by the modulation circuit 304) that swings between ground and VIN. When not operating in down-mode, the switch 308 drives the gate terminal 110G of the high-side transistor 110 with a drive signal (e.g., the modulation signal generated by the modulation circuit 304) that swings between ground and VOUT. The switch 308 includes a terminal 308A coupled to the gate terminal 110G of the high-side transistor 110, a terminal 308B coupled to the output terminal 312B of the driver 312, a terminal 308C coupled to the output terminal 310B of the driver 310, and a control terminal 308D coupled to the output terminal 302A of the down-mode detection circuit 302.

The driver 310 produces the drive signal applied to the gate terminal 110G of the high-side transistor 110 when not operating in down-mode. The driver 310 receives the modulation signal generated by the modulation circuit 304, and swings the drive signal between VOUT and ground to turn on the high-side transistor 110 when the low-side transistor is off and turn off the high-side transistor 110 when the low-side transistor is on. The driver 310 includes an input terminal 310A coupled to the output terminal 304A of the modulation circuit 304 and an output terminal 310B coupled to a terminal 308C of the switch 308.

The driver 312 produces the drive signal applied to the gate terminal 110G of the high-side transistor 110 when operating in down-mode. The driver 312 inverts the modulation signal generated by the modulation circuit 304, and swings the drive signal between VIN and ground. The driver 312 includes an input terminal 312A coupled to the output terminal 304A of the modulation circuit 304 and an output terminal 312B coupled to a terminal 308B of the switch 308.

Figure 4:
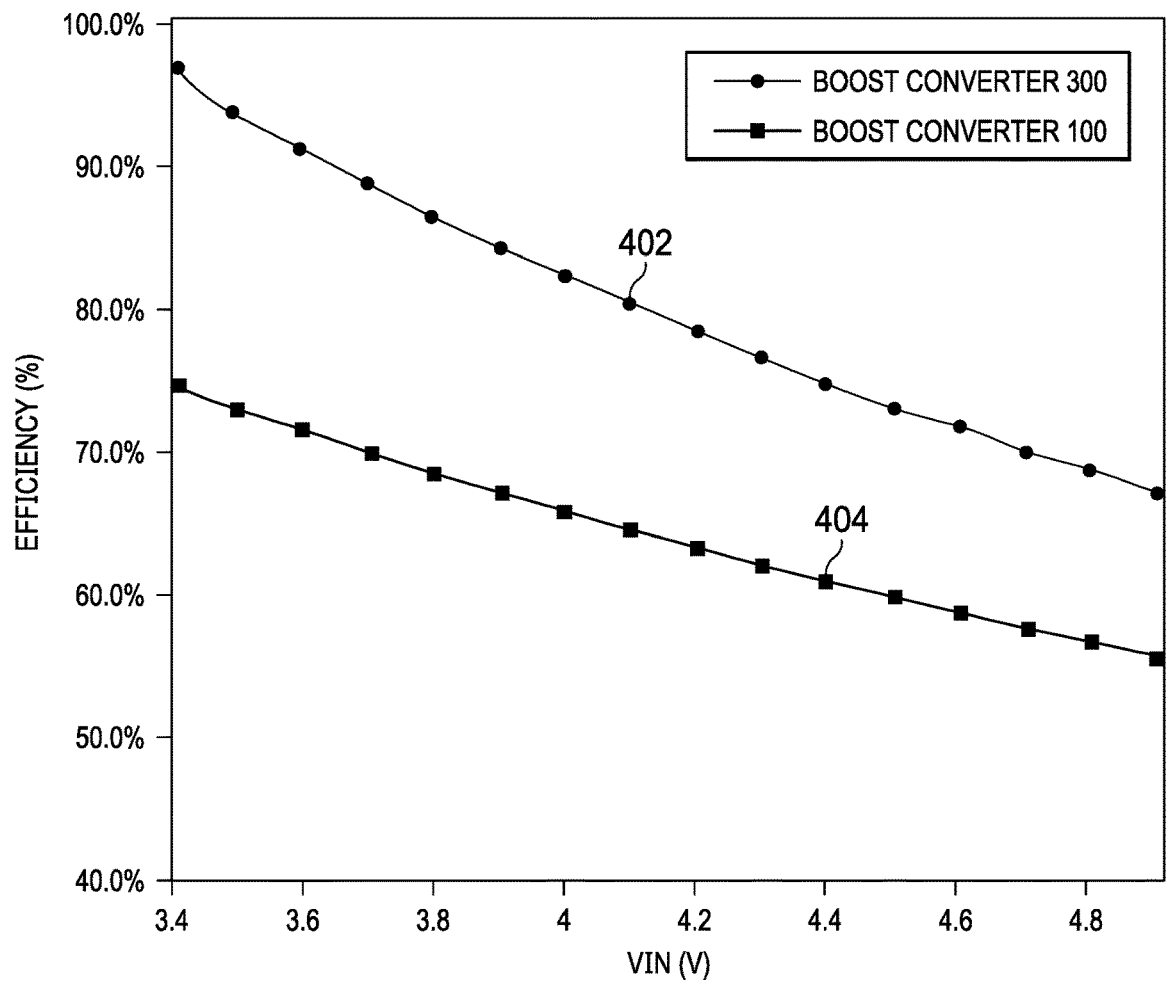
FIG. 4 shows a graph comparing efficiency of down-mode operation in the boost converter of FIG. 2 and FIGS. 1A-1C.

FIG. 4 shows a graph comparing efficiency of down-mode operation for boost converter 300 and boost converter 100. Curve 402 shows the efficiency of the boost converter 300 over a range of VIN values greater than VOUT (e.g. VOUT is 3.3 volts). Curve 404 shows the efficiency of the boost converter 100 under the same conditions. The boost converter 300 is significantly more efficient than the boost converter 100 at the illustrated input voltages.

Figure 5A:
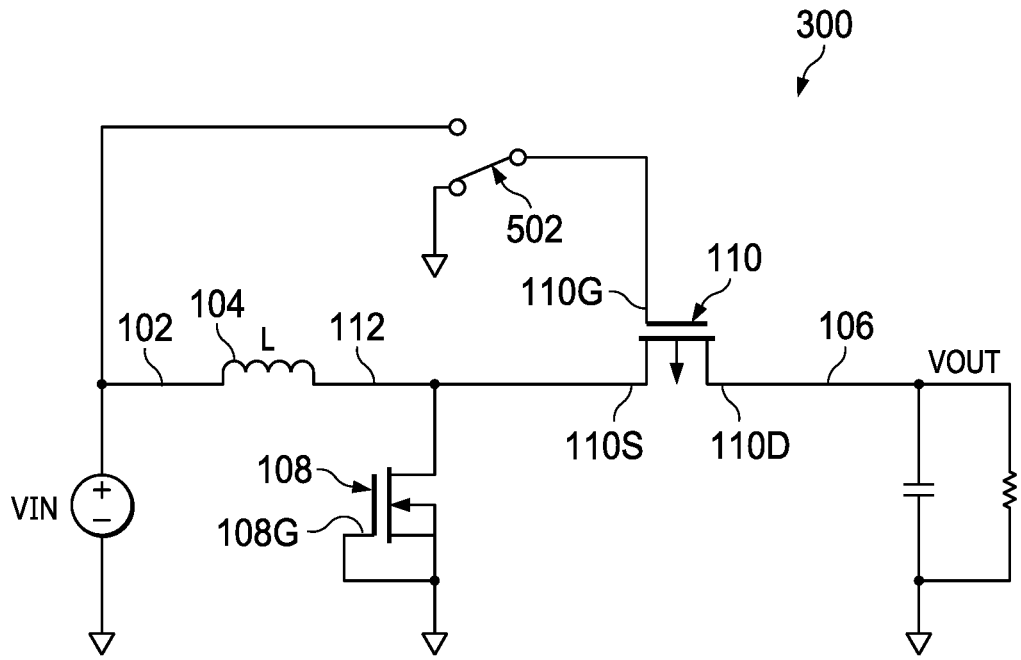
FIGS. 5A and 5B show examples of high-efficiency down-mode operation in a boost converter.
Figure 5B:
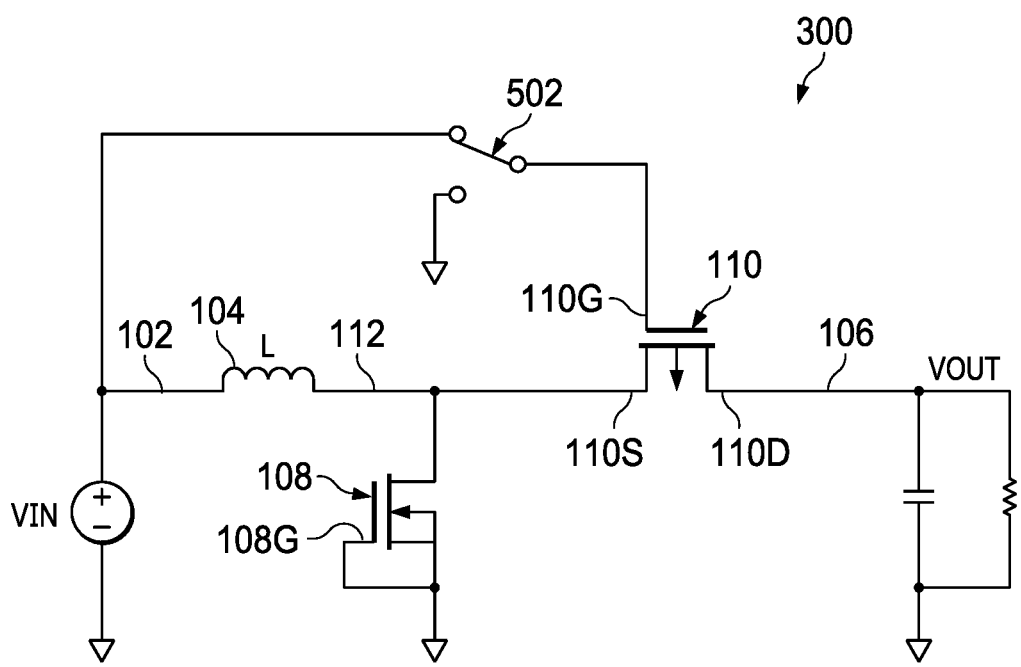

FIGS. 5A and 5B illustrate high-efficiency down-mode operation of boost converter 300. The low-side transistor 108 is turned off in both FIGS. 5A and 5B by connecting the gate terminal 108G to ground (where transistor 108 is an n-channel MOSFET). In the switch 308 (FIG. 3), the terminal 308A is connected to the terminal 308B to pass output of the driver 312 (FIG. 3) to the high-side transistor 110. Switching of the switch 502 in FIGS. 5A and 5B represents switching within the driver 312. When the modulation signal provided by the modulation circuit 304 is a logic high, the driver 312 inverts the modulation signal to turn on the high-side transistor 110. Correspondingly, in FIG. 5A, the switch 502 connects the gate terminal 110G of the high-side transistor 110 to ground to fully turn on the high-side transistor 110 (where high-side transistor 110 is a p-type MOS transistor such as a p-channel MOSFET) in a first portion of a modulation cycle (first logic level of the modulation signal). The current in the inductor 104 increases as VIN is greater than VOUT.

When the modulation signal provided by the modulation circuit 304 (FIG. 3) is a logic low, the driver 312 (FIG. 3) inverts the modulation signal to provide VIN to the high-side transistor 110. Correspondingly, in FIG. 5A, the switch 502 connects VIN to the gate terminal 110G of the high-side transistor 110 causing the high-side transistor 110 to operate in saturation mode in a second portion of the modulation cycle (second logic level of the modulation signal). The voltage across the inductor 104 is Ur, and current in the inductor 104 decreases.

Figure 6:
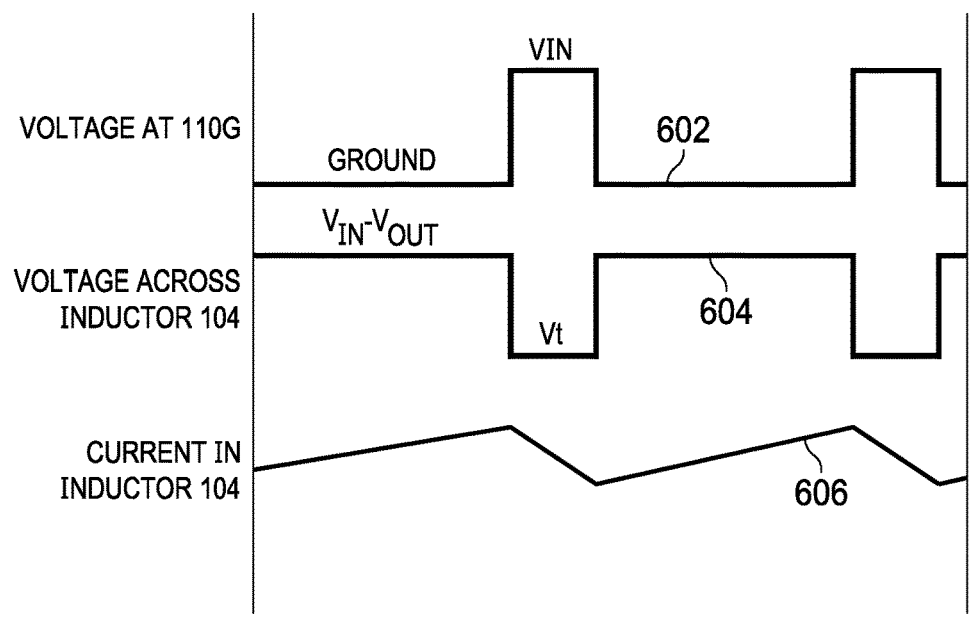
FIG. 6 shows example signals produced in a boost converter with high-efficiency down-mode operation.

FIG. 6 shows example signals for the boost converter 300 during down-mode operation. When the gate terminal 110G of the high-side transistor 110 is at ground voltage, the high-side transistor 110 is fully on (when it is implemented with a p-channel MOSFET), the voltage across the inductor 104 is VIN-VOUT, and the current in the inductor 104 increases. When the gate terminal 110G of the high-side transistor 110 is at VIN, the high-side transistor 110 is saturated, the voltage across the inductor 104 is Ur, and the current in the inductor 104 decreases (the inductor 104 discharges).

Figure 7:
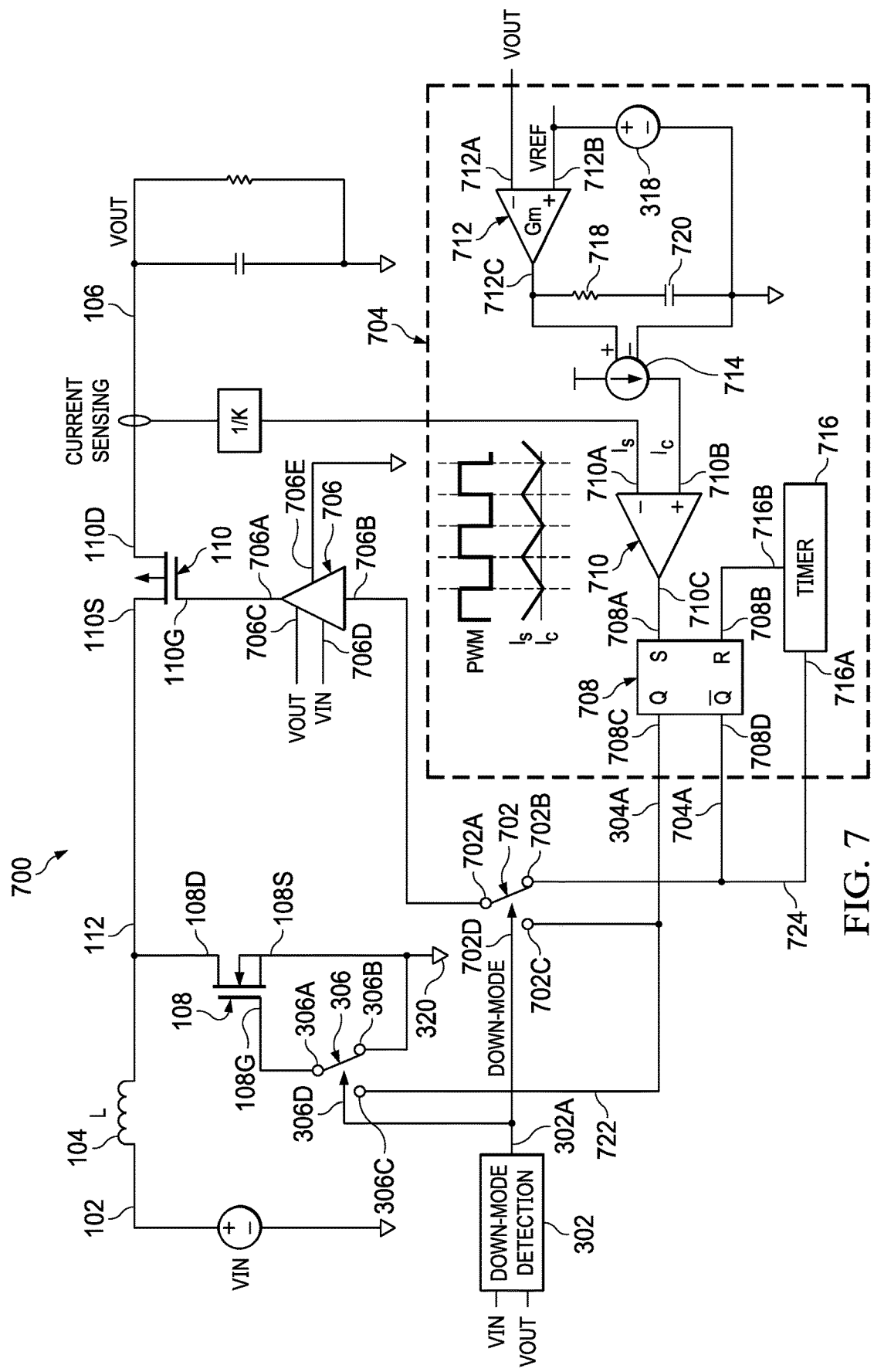
FIG. 7 shows a block diagram for an example boost converter that includes high efficiency down-mode operation.

FIG. 7 shows a block diagram for an example boost converter 700 that provides high efficiency down-mode operation. The boost converter 700 includes the input terminal 102, the inductor 104, the output terminal 106, the low-side transistor 108, the high-side transistor 110, the switching terminal 112, the down-mode detection circuit 302, and the switch 306. The boost converter 700 also includes a switch 702, a modulation circuit 704, and a driver circuit 706.

The down-mode detection circuit 302 is coupled to the switch 306 and the switch 702 to control operation of the low-side transistor 108 and the high-side transistor 110 based on whether the boost converter 700 is operating in down-mode. The switch 306 turns off the low-side transistor 108 (by connecting terminal 306A to 306B) while the boost converter 700 is operating in down-mode, and modulates the low-side transistor 108 (by connecting terminal 306A to 306C) when the boost converter 700 is not operating in down-mode.

The modulation circuit 704 generates a modulation signal to turn the low-side transistor 108 and the high-side transistor 110 on and off to generate VOUT based on VIN. The modulation circuit 704 includes the output terminal 304A, an output terminal 704A, a flip-flop 708, a comparator 710, an error amplifier 712, and a timer circuit 716. The error amplifier 712 generates an error signal representative of the difference between VOUT and the reference voltage provided by the reference voltage circuit 318. The error signal is converted to a current by the current source 714. The resistor 718 and capacitor 720 form a low pass filter and filter the error signal generated by the error amplifier 712. The error amplifier 712 includes an input terminal 712A coupled the output terminal 106, an input terminal 712B coupled to the reference voltage circuit 318, and an output terminal 712C coupled to the current source 714.

The error current provided by the current source 714 is compared, by the comparator 710, to the current sensed at the output terminal 106 (downscaled by a scaling value $$\frac{1}{K}).$$

When the current ($I_S$) sensed at the output terminal 106 is less than the error current ($I_C$), the comparator 710 sets the flip-flop 708. The comparator 710 includes an input terminal 710A coupled the output terminal 106, an input terminal 710B coupled to the current source 714, and an output terminal 710C coupled to an input terminal 708A of the flip-flop 708. Setting the flip-flop 708 triggers the timer circuit 716 to time a predetermined interval. On expiration of the predetermined interval, the timer circuit 716 resets the flip-flop 708. The timer circuit 716 includes an input terminal 716A coupled to the inverted output terminal 708D of the flip-flop 708, and an output terminal 716B coupled to the reset input 708B of the flip-flop 708. The outputs of the flip-flop 708 are the modulation signal applied to control the low-side transistor 108 and an inverted version of the modulation signal applied to control the high-side transistor 110 during down-mode operation.

The flip-flop 708 includes an output terminal 708C and an output terminal 708D. The output terminal 708C is coupled to the output terminal 304A of the modulation circuit 704, and the output terminal 708D is coupled to the output terminal 704A of the modulation circuit 704. The modulation signal 722 is output at the output terminal 708C and an inverted modulation signal 724 is output at the 708D. The output terminal 708C is coupled to the terminal 306C of the switch 306 and the terminal 702C of the switch 702. The output terminal 708D of the flip-flop 708 is coupled to the terminal 702B of the switch 702. The switch 702 controls application of the modulation signal 722 or the inverted modulation signal 724 to the high-side transistor 110. The switch 702 includes a control terminal 702D coupled to the output terminal 302A of the down-mode detection circuit 302, and a terminal 702A coupled to an input terminal 706B of the driver circuit 706. When the boost converter 700 is operating in down-mode, the switch 702 routes the inverted modulation signal 724 to the high-side transistor 110. When the boost converter 700 is not operating in down-mode the switch 702 routes the modulation signal 722 to the high-side transistor 110.

The driver circuit 706 drives the high-side transistor 110, and sets the voltage of the drive signal provided to the high-side transistor 110 based on which of VIN or VOUT is greater. When operating in down-mode, VIN is greater than VOUT, and the drive signal provided by the driver circuit 706 transitions between VIN and ground. When not operating in down-mode, VOUT is greater than VIN, and the drive signal provided by the driver circuit 706 transitions between VOUT and ground. The driver circuit 706 includes the input terminal 706B coupled to the terminal 702A, an output terminal 706A coupled to the gate terminal 110G of the high-side transistor 110, a power terminal 706C coupled to the output terminal 106, a power terminal 706D coupled to the input terminal 102, and a terminal 706E coupled to the ground terminal 320.

Figure 8:
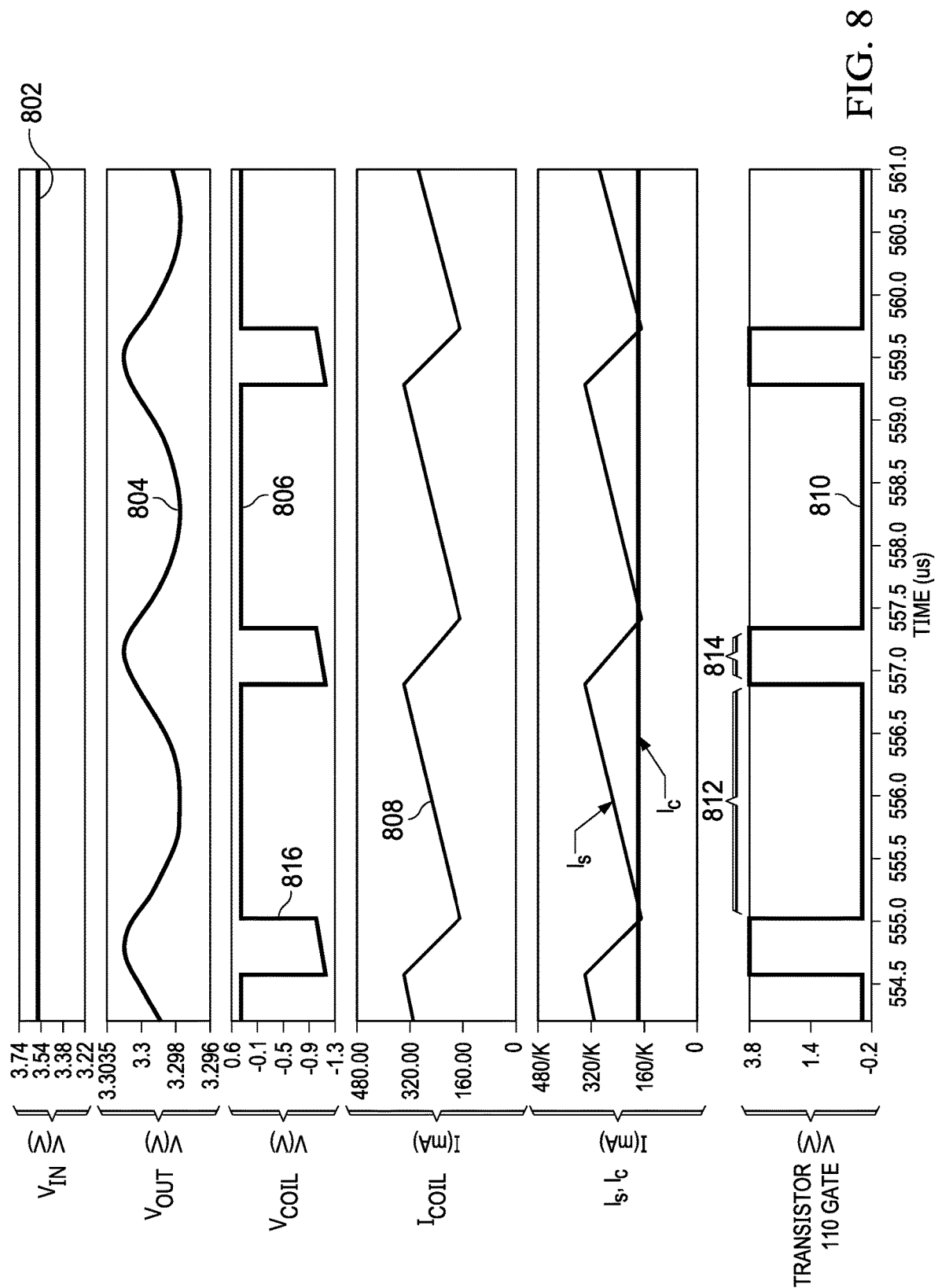
FIG. 8 shows example signals generated in the boost converter of FIG. 7 while operating in down-mode.

FIG. 8 shows example signals for the boost converter 700 during down-mode operation. In FIG. 8, VIN 802 is 3.6 volts and the boost converter 700 is configured to generate VOUT 804 of 3.3 volts. The driver circuit 706 provides the drive signal 810 at the gate terminal 110G of the high-side transistor 110 to modulate the high-side transistor 110. The drive signal 810 is a version of the inverted modulation signal 724 generated by the modulation circuit 704 that transitions from 3.6 volts (VIN) to ground. In the charge interval 812, the drive signal 810 is at or near to ground to fully turn on the high-side transistor 110. and the timer circuit 716 is active to time the charge interval. In the charge interval 812, the current 808 in the inductor 104 increases and the voltage 806 across the inductor 104 increases at edge 816. When the timer circuit 716 reaches a predetermined value, the flip-flop 708 is reset, the charge interval 812 ends and the discharge interval 814 begins. In the discharge interval 814, the drive signal 810 is at about 3.6 volts (VIN), and the high-side transistor 110 is in saturation mode. The current 808 in the inductor 104 decreases and the voltage 806 across the inductor 104 is around $-V_f$. When the current flowing through the high-side transistor 110 to the output terminal 106 falls and the sensed current $I_S$ falls to $I_C$, the comparator 710 sets the flip-flop 708 to turn on the high-side transistor 110 and initiate a next charging interval. The voltage 806 across the inductor 104 varies by about 1.3 volts in this example (versus about 4.6 volts for down-mode operation of the boost converter 100 under similar conditions) to reduce circuit generated noise. VOUT 804 is nominally 3.3 volts with ripple of about 5 millivolts.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A boost converter, comprising:
    a down-mode detection circuit having a detection output;
    a modulation circuit having a modulation output;
    a low-side transistor coupled between a switching terminal and a ground terminal, and having a low-side control terminal;
    a first switch having first, second and third switch terminals and a first switch control terminal, wherein the first switch terminal is coupled to the low-side control terminal, the second switch terminal is coupled to the modulation output, the third switch terminal is coupled to the ground terminal, and the first switch control terminal is coupled to the detection output;
    a high-side transistor coupled between the switching terminal and a converter output terminal, and having a high-side control terminal; and
    a second switch having fourth, fifth and sixth switch terminals and a second switch control terminal, wherein the fourth switch terminal is coupled to the high-side control terminal, the fifth switch terminal is coupled to the modulation output, the sixth switch terminal is coupled to the modulation output through an inverter, and the second switch control terminal is coupled to the detection output.

2. The boost converter of claim 1, wherein the modulation output is a first modulation output, and the modulation circuit further includes a second modulation output.

3. The boost converter of claim 1, further comprising a driver circuit having a driver input and a driver output, wherein the driver input is coupled to the modulator output, and the driver output is coupled to the modulation output.

4. The boost converter of claim 1, wherein the modulation circuit includes an error amplifier having a first error input, a second error input and an error output, wherein the first error input is coupled to the converter output terminal, and the second error input is coupled to a reference voltage terminal.

5. The boost converter of claim 4, wherein the modulation circuit further includes a comparator having a first comparator input, a second comparator input, and a comparator output, wherein the first comparator input is coupled to the error output, and the second comparator input is coupled to the converter output terminal.

6. The boost converter of claim 5, wherein the modulation circuit further includes:

a flip-flop having a first and second flip-flop inputs and first and second flip-flop outputs, wherein the first flip-flop input coupled to the comparator output, and the first flip-flop output is coupled to the modulation output; and a timer circuit having a timer input and a timer output, wherein the timer input is coupled to the second flip-flop output, and the timer output is coupled to the second flip-flop input.

7. A boost converter, comprising:

a low-side transistor coupled between a switching terminal and a ground terminal, and having a low-side control terminal;

a down-mode detection circuit having a detection output coupled to the low-side control terminal, and configured to turn off the low-side transistor responsive to a voltage at a converter output terminal being greater than a voltage at a converter input terminal;

a modulation circuit having a modulation output, wherein the modulation circuit is configured to provide a modulation signal at the modulation output; and a switch having first and second switch paths, wherein the first switch path is configured to couple the modulation output to the low-side control terminal responsive to the voltage at the converter output terminal being greater than the voltage at the converter input terminal, and the second switch path is configured to couple a ground terminal to the low-side control terminal responsive to the voltage at the converter output terminal being less than the voltage at the converter input terminal.

8. The boost converter of claim 7, further comprising:

a high-side transistor coupled between the switching terminal and the converter output terminal, and having a high-side control terminal; and a switch having first and second switch paths, wherein the first switch path selectively couples the modulation output to the high-side control terminal responsive to the voltage at the converter output terminal being less than the voltage at the converter input terminal, and the second switch path is selectively provides an inverted modulation signal to the high-side control terminal responsive to the voltage at the converter output terminal being greater than the voltage at the converter input terminal.

9. The boost converter of claim 8, further comprising a driver circuit having a driver input and a driver output, wherein the driver input is coupled to the modulation output, and the driver output is selectively coupled to the high-side control terminal responsive to the voltage at the converter output terminal being less than the voltage at the converter input terminal, or the driver output is selectively coupled to the inverted modulation signal responsive to the voltage at the converter output terminal being greater than the voltage at the converter input terminal.

10. The boost converter of claim 8, wherein responsive to the voltage at the converter output terminal being less than the voltage at the converter input terminal, the switch is configured to:

connect the ground terminal to the high-side transistor responsive to the modulation signal having a first logic level; and connect the converter input terminal to the high-side transistor responsive to the modulation signal having a second logic level that is different from the first logic level.

11. The boost converter of claim 10, wherein responsive to the voltage at the converter output terminal being greater than the voltage at the converter input terminal, the switch is configured to:

connect the converter output terminal to the high-side transistor responsive to the modulation signal having the first logic level; and connect the ground terminal to the high-side transistor responsive to the modulation signal having the second logic level.

12. The boost converter of claim 10, wherein the modulation circuit includes:

a flip-flop configured to provide the modulation signal and an inverted modulation signal;

an error amplifier having an error amplifier output, wherein the error amplifier is configured to provide an error signal at the error amplifier output, the error signal being a difference of a reference voltage and the voltage at the converter output terminal;

a comparator configured to set the flip-flop responsive to a comparison of the error signal and a current sensed at the converter output terminal; and a timer circuit configured to reset the flip-flop.

13. A boost converter, comprising:

a high-side transistor coupled between a switching terminal and a converter output terminal, and having a high-side control terminal;

a first switch coupled to the high-side control terminal, and configured to, in a down-mode, modulate a voltage at the high-side control terminal between ground and a voltage at a converter input terminal;

a low-side transistor coupled between the switching terminal and a ground terminal, and having a low-side control terminal;

a second switch coupled to the low-side control terminal, and configured to, in the down-mode, hold a voltage at the low-side control terminal at ground; and a down-mode detection circuit coupled to the first switch and the second switch, and configured to detect the down-mode responsive to a voltage at the converter output terminal being greater than a voltage at the converter input terminal.

14. The boost converter of claim 13, further comprising a modulation circuit having a modulation output, wherein the modulation circuit is configured to provide a modulation signal at the modulation output.

15. The boost converter of claim 14, wherein the first switch is coupled to the modulation circuit and configured to:

in a boost mode, apply a modulation signal to modulate the voltage at the high-side control terminal between ground and a voltage at the converter output terminal; and in the down-mode, apply an inverted modulation signal to the high-side control terminal.

16. The boost converter of claim 14, wherein the second switch is coupled to the modulation circuit and configured to, in a boost mode, provide the modulation signal to the low-side control terminal.

* * * * *